US011573656B2

(12) United States Patent
Isaacson et al.

(10) Patent No.: US 11,573,656 B2
(45) Date of Patent: Feb. 7, 2023

(54) PRE-LOADING A RESISTIVE TOUCH SENSOR DEVICE VIA LAMINATION OF DIFFERENTLY CURVED SURFACES

(71) Applicant: Sensel, Inc., Mountain View, CA (US)

(72) Inventors: Scott Isaacson, Mountain View, CA (US); Ilya Daniel Rosenberg, Mountain View, CA (US)

(73) Assignee: Sensel, Inc., Mountain View, CA (US)

( * ) Notice: Subject to any disclaimer, the term of this patent is extended or adjusted under 35 U.S.C. 154(b) by 50 days.

(21) Appl. No.: 16/897,661

(22) Filed: Jun. 10, 2020

(65) Prior Publication Data

US 2020/0319736 A1 Oct. 8, 2020

Related U.S. Application Data

(62) Division of application No. 15/962,041, filed on Apr. 25, 2018, now Pat. No. 10,712,892.

(Continued)

(51) Int. Cl.
*G06F 3/041* (2006.01)
*G06F 3/045* (2006.01)
(Continued)

(52) U.S. Cl.
CPC ......... *G06F 3/04146* (2019.05); *G01B 7/287* (2013.01); *G06F 3/045* (2013.01);
(Continued)

(58) Field of Classification Search
CPC .......... G06F 3/045; G06F 2203/04103; H05K 1/028; H05K 5/0017; H05K 5/03; H01C 10/106
See application file for complete search history.

(56) References Cited

U.S. PATENT DOCUMENTS 9,012,015 B2 * 4/2015 Sakamoto ......... B32B 17/10449
428/426
9,274,562 B2 * 3/2016 Franklin ............... H01M 50/20
(Continued)

FOREIGN PATENT DOCUMENTS

CA 2757611 A1 5/2012
CN 203930741 11/2014
(Continued)

OTHER PUBLICATIONS

International Search Report and Written Opinion for International Application Serial No. PCT/US18/29604 dated Aug. 30, 2018, 11 pages.
(Continued)

*Primary Examiner* — Amy Onyekaba
(74) *Attorney, Agent, or Firm* — Amin, Turocy & Watson, LLP

(57) ABSTRACT

Systems and methods for generating a compressive pre-load in a resistive touch center through the lamination of differently curved surfaces. The system comprising a processor; and a memory that stores executable instructions that, when executed by the processor, facilitate performance of operations, comprising: determining a first curvature of a rigid back layer comprising a grouping of sensor electrodes; determining a second curvature of a flexible surface layer; and as a function of the first curvature and the second curvature facilitating lamination of the flexible surface layer to the rigid back layer.

20 Claims, 17 Drawing Sheets

Related U.S. Application Data

(60) Provisional application No. 62/490,232, filed on Apr. 26, 2017.

(51) Int. Cl.
*H05K 1/02* (2006.01)
*H01C 10/10* (2006.01)
*G01B 7/287* (2006.01)
*H05K 5/03* (2006.01)
*H05K 5/00* (2006.01)

(52) U.S. Cl.
CPC .......... *H05K 1/028* (2013.01); *H05K 5/0017* (2013.01); *H05K 5/03* (2013.01); *G06F 2203/04103* (2013.01); *H01C 10/106* (2013.01)

(56) References Cited

U.S. PATENT DOCUMENTS

| | | | | |
|---|---|---|---|---|
| 9,990,066 | B2* | 6/2018 | Ma | G06F 1/1637 |
| 11,203,182 | B2* | 12/2021 | Fukatani | B32B 7/023 |
| 2002/0180710 | A1* | 12/2002 | Roberts | G06F 3/04142 |
| | | | | 345/173 |
| 2002/0194934 | A1 | 12/2002 | Taylor | |
| 2006/0050028 | A1* | 3/2006 | Pasch | G02B 26/0833 |
| | | | | 345/76 |
| 2007/0085837 | A1* | 4/2007 | Ricks | G02F 1/1334 |
| | | | | 345/173 |
| 2007/0119698 | A1* | 5/2007 | Day | G06F 3/0416 |
| | | | | 200/510 |
| 2007/0212906 | A1* | 9/2007 | Clayton | H05K 1/189 |
| | | | | 257/E21.705 |
| 2007/0257821 | A1* | 11/2007 | Son | G06F 3/0445 |
| | | | | 341/23 |
| 2009/0002199 | A1* | 1/2009 | Lainonen | H03K 17/964 |
| | | | | 341/20 |
| 2009/0151475 | A1* | 6/2009 | Masaki | G01L 1/146 |
| | | | | 73/862.68 |
| 2009/0257626 | A1* | 10/2009 | Sherlock | G06V 40/1329 |
| | | | | 382/126 |
| 2011/0007023 | A1* | 1/2011 | Abrahamsson | G06F 3/0416 |
| | | | | 345/174 |
| 2012/0086666 | A1* | 4/2012 | Badaye | G06F 3/0446 |
| | | | | 345/174 |
| 2012/0092363 | A1* | 4/2012 | Kim | G06F 3/147 |
| | | | | 345/618 |
| 2012/0111491 | A1 | 5/2012 | Huang et al. | |
| 2012/0162122 | A1* | 6/2012 | Geaghan | G01L 1/205 |
| | | | | 702/41 |
| 2012/0242588 | A1* | 9/2012 | Myers | G06F 1/1637 |
| | | | | 345/173 |
| 2012/0318070 | A1* | 12/2012 | Evans | G01L 25/00 |
| | | | | 73/862.68 |
| 2013/0063391 | A1* | 3/2013 | Kang | G06F 3/045 |
| | | | | 345/174 |
| 2013/0096849 | A1* | 4/2013 | Campbell | G06F 3/04144 |
| | | | | 702/41 |
| 2013/0271161 | A1* | 10/2013 | Solven | G06F 3/0445 |
| | | | | 324/661 |
| 2014/0098075 | A1* | 4/2014 | Kwak | G09G 3/2003 |
| | | | | 345/204 |
| 2014/0238152 | A1* | 8/2014 | Kallassi | G01L 1/146 |
| | | | | 73/862.626 |
| 2015/0015513 | A1* | 1/2015 | Kwak | G06F 1/3231 |
| | | | | 345/173 |
| 2015/0035812 | A1* | 2/2015 | Shin | G06F 1/1601 |
| | | | | 345/204 |
| 2015/0091858 | A1* | 4/2015 | Rosenberg | G06F 3/04144 |
| | | | | 345/174 |
| 2015/0253914 | A1* | 9/2015 | Hamada | B32B 7/12 |
| | | | | 345/173 |
| 2015/0378391 | A1* | 12/2015 | Huitema | G06F 1/163 |
| | | | | 361/679.03 |
| 2016/0033343 | A1* | 2/2016 | Park | G01L 1/146 |
| | | | | 73/862.046 |
| 2016/0037625 | A1* | 2/2016 | Huitema | G09F 9/301 |
| | | | | 361/749 |
| 2016/0070392 | A1* | 3/2016 | Wang | H03K 17/9643 |
| | | | | 345/173 |
| 2016/0081180 | A1* | 3/2016 | Huitema | G06F 1/163 |
| | | | | 361/749 |
| 2016/0103544 | A1* | 4/2016 | Filiz | G06F 3/0412 |
| | | | | 345/174 |
| 2016/0103545 | A1* | 4/2016 | Filiz | G06F 3/0418 |
| | | | | 345/174 |
| 2016/0147353 | A1* | 5/2016 | Filiz | G01L 1/20 |
| | | | | 345/174 |
| 2016/0299579 | A1* | 10/2016 | Kim | G06F 1/1626 |
| 2016/0371043 | A1* | 12/2016 | Gupta | G06F 1/1652 |
| 2017/0031491 | A1* | 2/2017 | Bao | G06F 3/04144 |
| 2017/0034906 | A1* | 2/2017 | Myung | H05K 1/0281 |
| 2017/0090655 | A1* | 3/2017 | Zhang | G06F 3/0412 |
| 2017/0146414 | A1* | 5/2017 | Ben Abdelaziz | G01L 5/22 |
| 2017/0205937 | A1* | 7/2017 | Zhang | G06F 3/0488 |
| 2017/0350774 | A1* | 12/2017 | Woodbury | G01L 1/243 |
| 2018/0004337 | A1* | 1/2018 | El Kallassi | G06F 3/0447 |
| 2018/0196568 | A1* | 7/2018 | McCalley | G06F 3/0421 |
| 2019/0079637 | A1* | 3/2019 | Kocovski | G06F 3/0421 |

FOREIGN PATENT DOCUMENTS

| | | |
|---|---|---|
| CN | 105955549 A | 9/2016 |
| EP | 2294502 A1 | 3/2011 |
| KR | 20130099459 | 9/2013 |
| TW | 201238416 | 9/2012 |
| WO | 2009134727 A1 | 11/2009 |
| WO | 2011021579 A1 | 1/2013 |

OTHER PUBLICATIONS

Non-Final Office Action received for U.S. Appl. No. 15/962,041 dated Sep. 27, 2019, 26 pages.

Notice of Allowance received for U.S. Appl. No. 15/962,041 dated Mar. 10, 2020, 31 pages.

First Office Action received for Chinese Patent Application Serial No. 201880005345.2 dated Dec. 28, 2021, 15 pages.

Second Office Action received for Chinese Patent Application Serial No. 201880005345.2 dated Aug. 18, 2022, 8 pages.

* cited by examiner

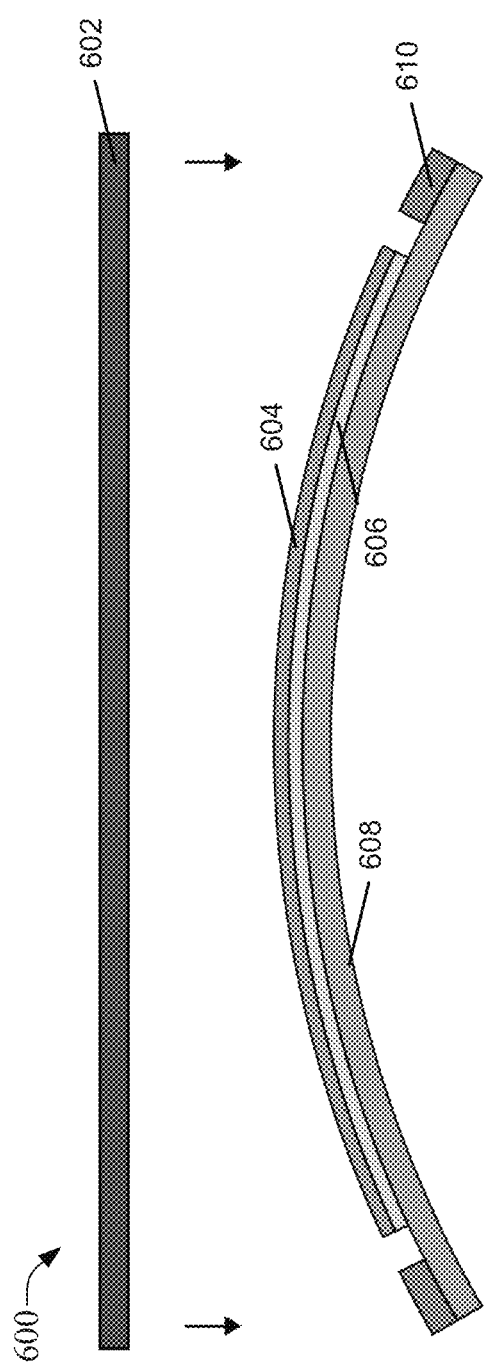
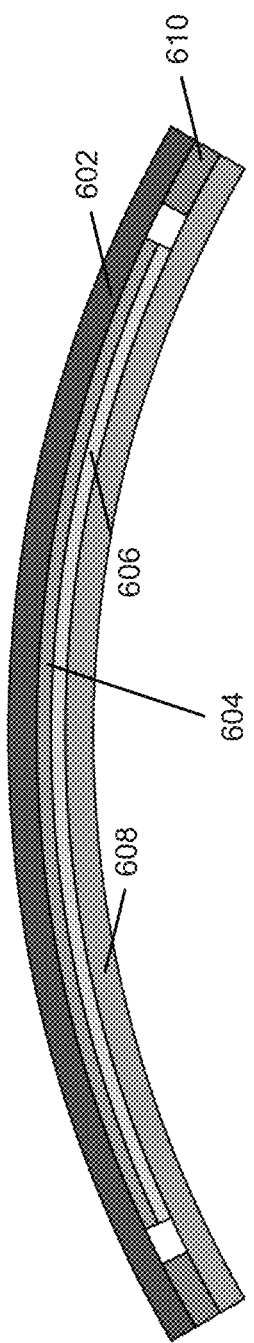
FIG. 6A
FIG. 6B

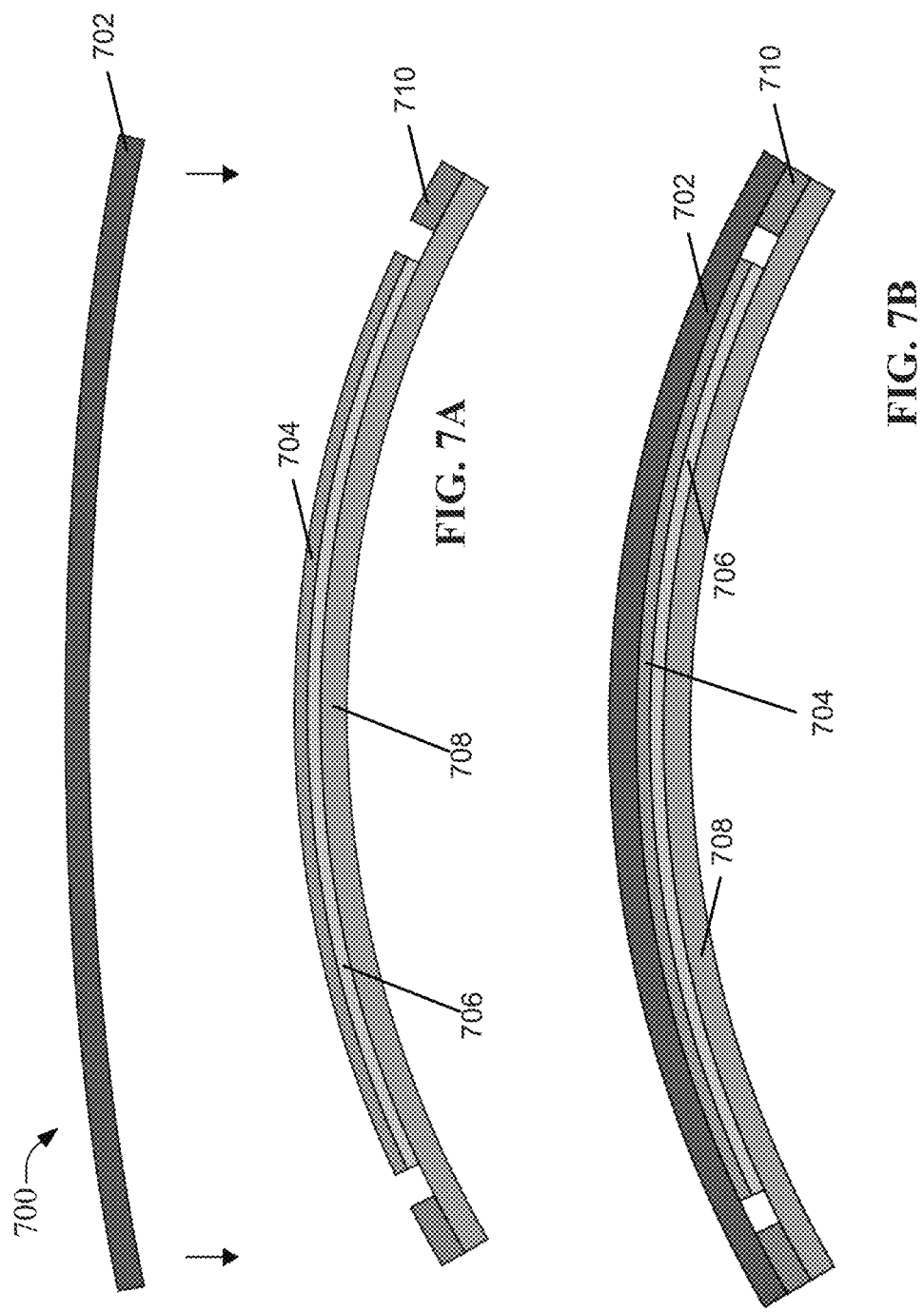

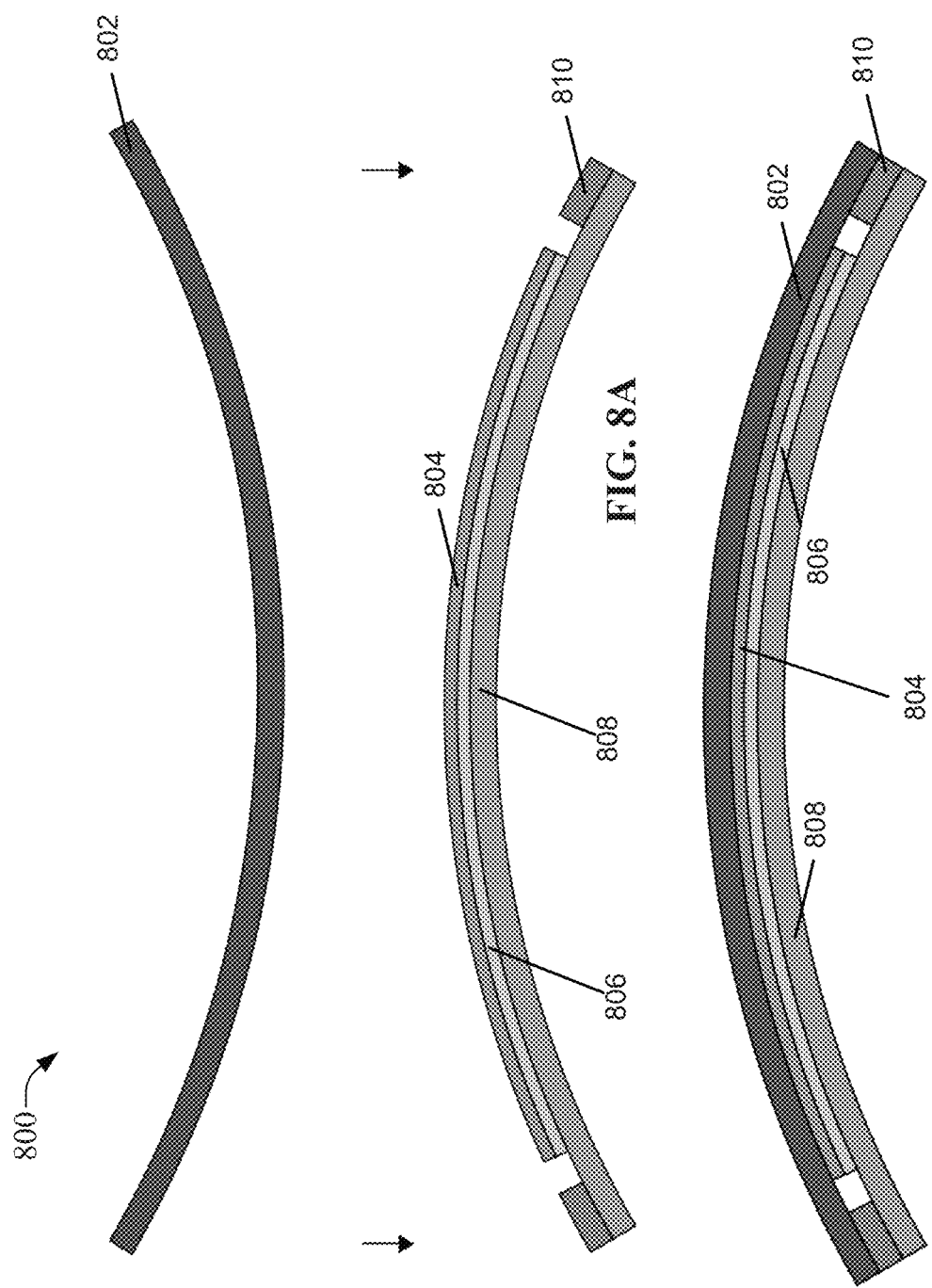

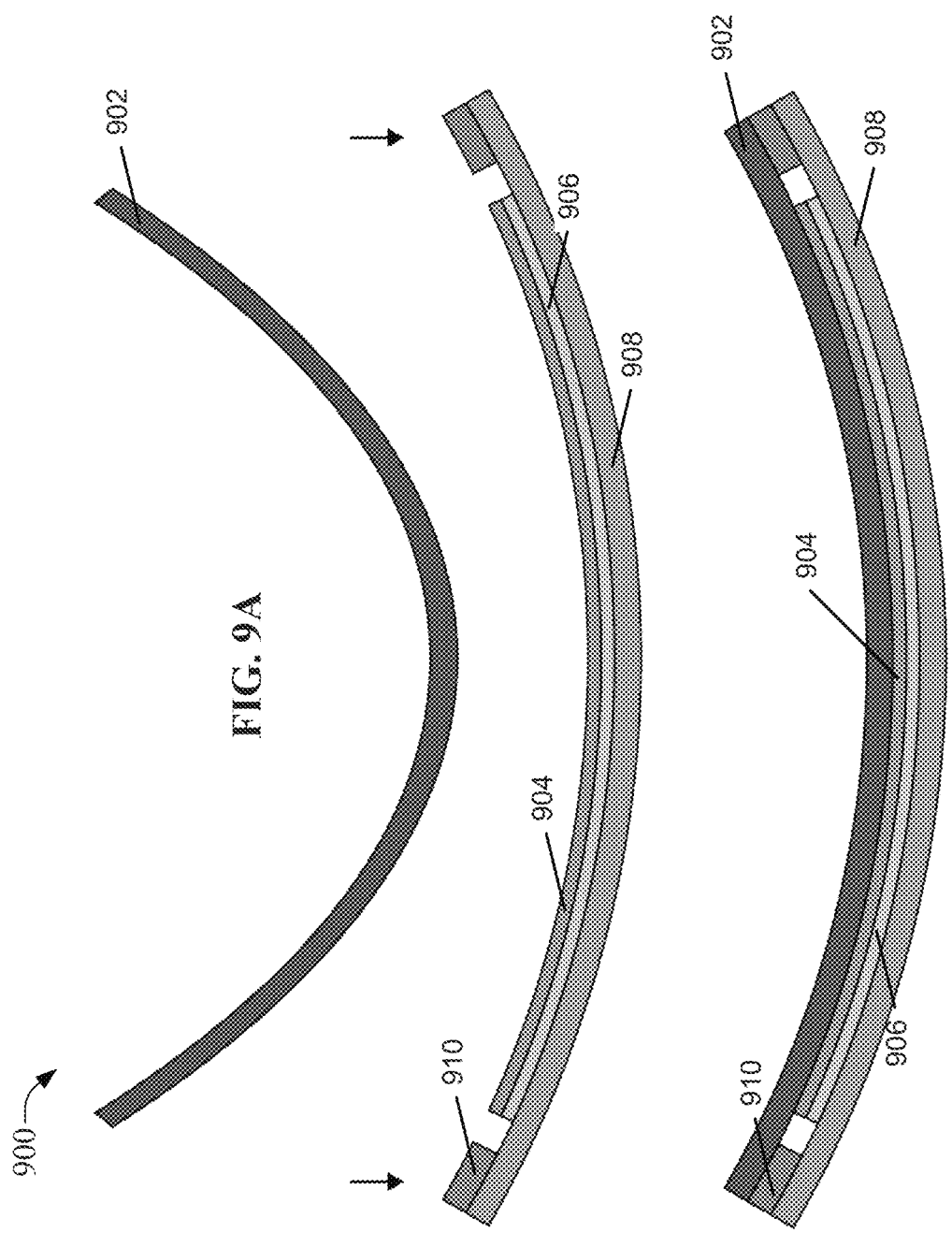

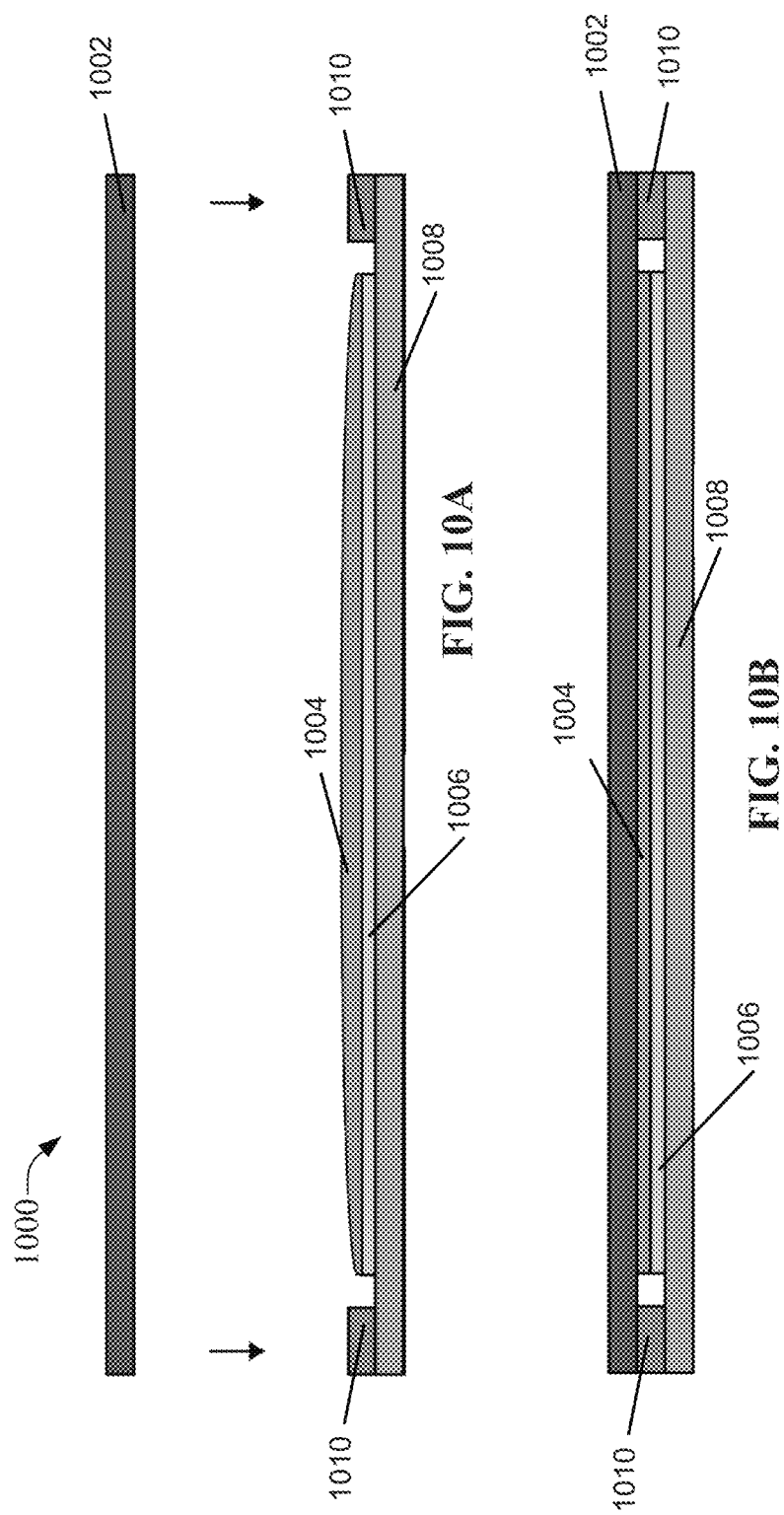

1500
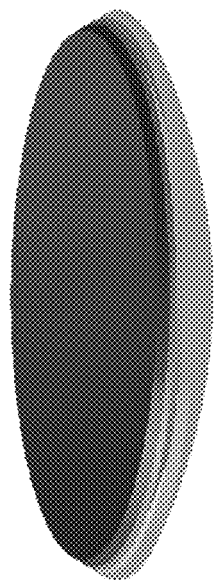
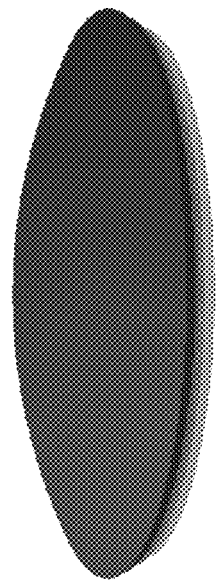
FIG. 15

PRE-LOADING A RESISTIVE TOUCH SENSOR DEVICE VIA LAMINATION OF DIFFERENTLY CURVED SURFACES

CROSS REFERENCE TO RELATED APPLICATIONS

The subject patent application is a divisional of, and claims priority to each of, U.S. patent application Ser. No. 15/962,041, titled: "PRE-LOADING A RESISTIVE TOUCH SENSOR DEVICE VIA LAMINATION OF DIFFERENTLY CURVED SURFACES," filed Apr. 25, 2018, and U.S. Provisional Patent Application Ser. No. 62/490,232, titled: "PRE-LOADING A RESISTIVE TOUCH SENSOR VIA LAMINATION OF DIFFERENTLY CURVED SURFACES," filed Apr. 26, 2017, the disclosures of which are hereby incorporated herein by reference in their entireties.

TECHNICAL FIELD

The disclosed subject matter relates to systems and methods for generating a compressive pre-load in a resistive touch sensor device through the lamination of differently curved surfaces.

BACKGROUND

Resistive touch sensor devices are typically constructed such that a conductive layer attached to an underside of a flexible membrane can be placed atop a grouping of sensor electrodes. The flexible membrane with a conductive layer on its underside (e.g., facing the sensor electrodes) can be referred to as a force sensing membrane, or FSM. The sensor operates by using the conductive layer (sometimes referred to as an force sensing resistive (FSR) material) to create a electrical pathway between sensor electrodes comprising drive sensor electrodes and sense sensor electrodes when a force is applied to the force sensing membrane (or a layer atop the force sensing membrane). To perform touch detection, a voltage is generally applied across adjacent sensor electrodes. When a force is applied to the force sensing membrane, the conductive layer (typically a conductive polymer composite) contacts the sensor electrodes and creates a new electrical path. Depending on sensor design, the magnitude, location, area, and other characteristics of this force can be determined by measuring voltage changes that can result from this new electrical path.

BRIEF DESCRIPTION OF DRAWINGS

FIGS. 6A and 6B illustrates additional acts for laminating a flexible surface to a rigid back, in accordance with aspects of the subject disclosure.

FIGS. 7A and 7B illustrates further acts for laminating a flexible surface to a rigid back, in accordance with aspects of the subject disclosure.

FIGS. 8A and 8B illustrates additional acts for laminating a flexible surface to a rigid back, in accordance with aspects of the subject disclosure.

FIGS. 9A and 9B illustrates yet additional acts for laminating a flexible surface to a rigid back, in accordance with aspects of the subject disclosure.

FIGS. 10A and 10B illustrates further acts for laminating a flexible surface to a rigid back, in accordance with aspects of the subject disclosure.

FIG. 15 illustrates example devices with two-dimensional curvatures, in accordance with described aspects of the subject disclosure.

DETAILED DESCRIPTION

Figure 1:
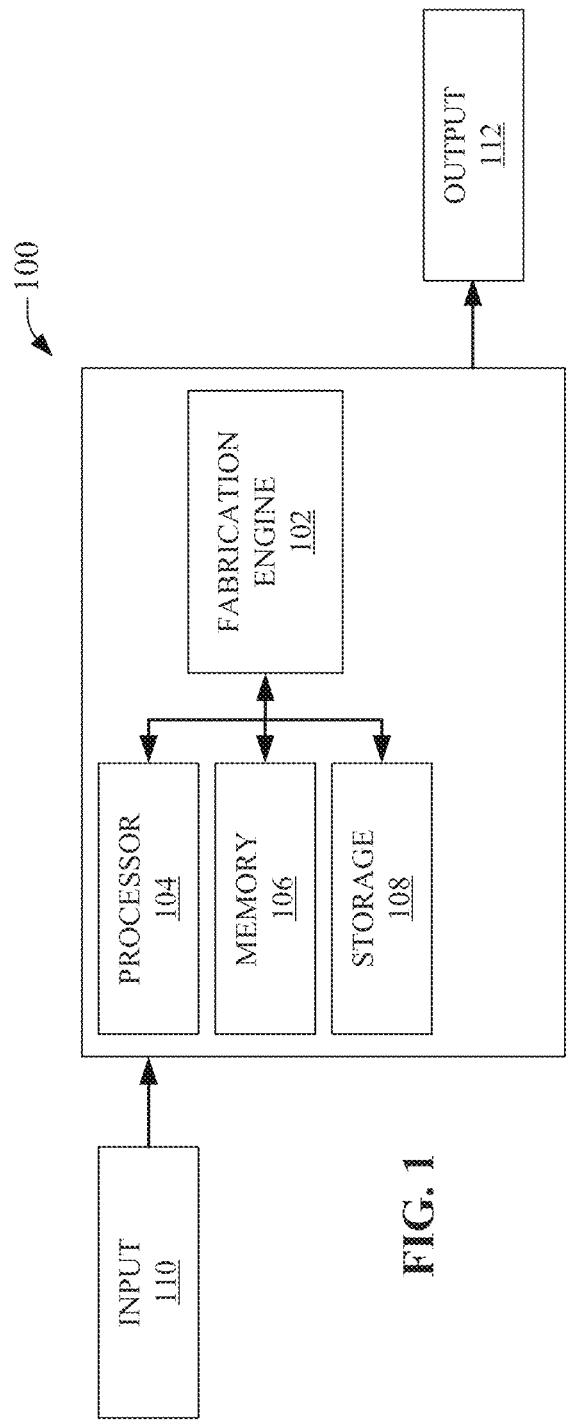
FIG. 1 is an illustration of a system for fabricating a sensor device that is preloaded via lamination of disparately curved surfaces, in accordance with aspects of the subject disclosure.

The subject disclosure is now described with reference to the drawings, wherein like reference numerals are used to refer to like elements throughout. In the following description, for purposes of explanation, numerous specific details are set forth in order to provide a thorough understanding of the subject disclosure. It may be evident, however, that the subject disclosure may be practiced without these specific details. In other instances, well-known structures and devices are shown in block diagram form in order to facilitate describing the subject disclosure.

It should be realized and appreciated by those of ordinary skill that the following non-limiting example application is merely an illustration of a use of the disclosed and described solution and is provided only for the purposes of exposition. The described and disclosed subject matter is therefore not limited to the following example applications, but can find applicability in other more generalized circumstances and use applications.

Figure 3:
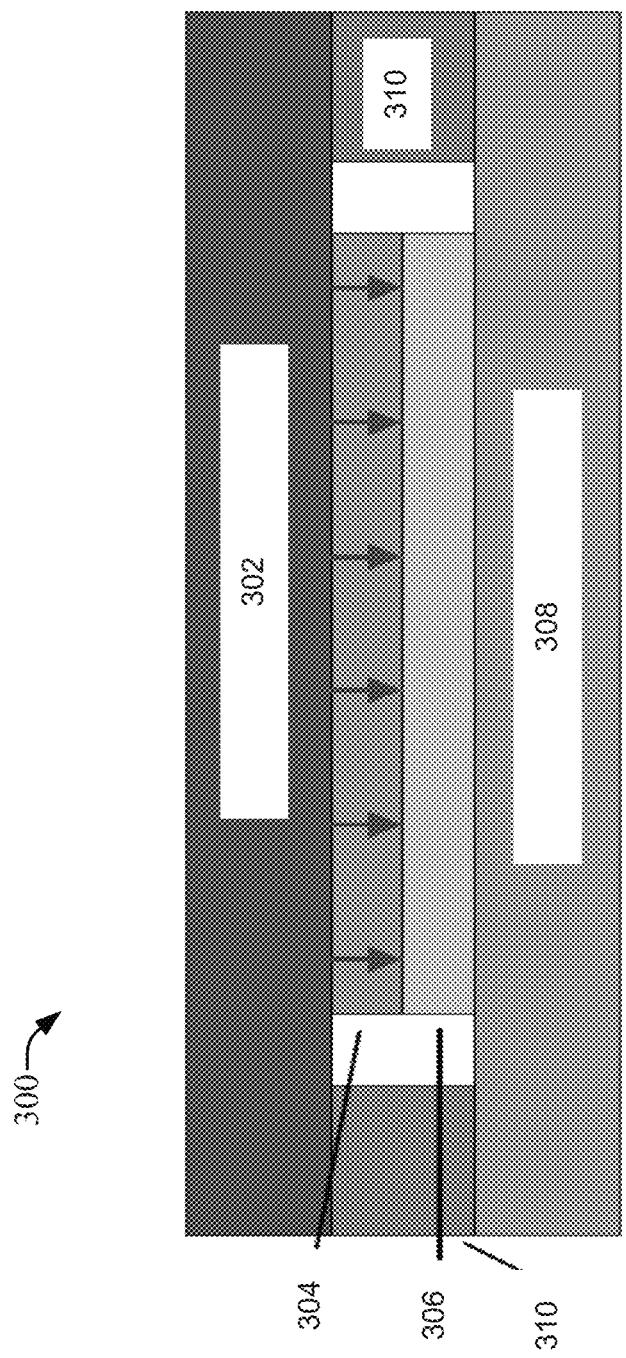
FIG. 3 provides illustration of a generalized cross-section of a device comprising a flexible surface laminated to a force sensor, in accordance with aspects of the subject disclosure.
Figure 4:
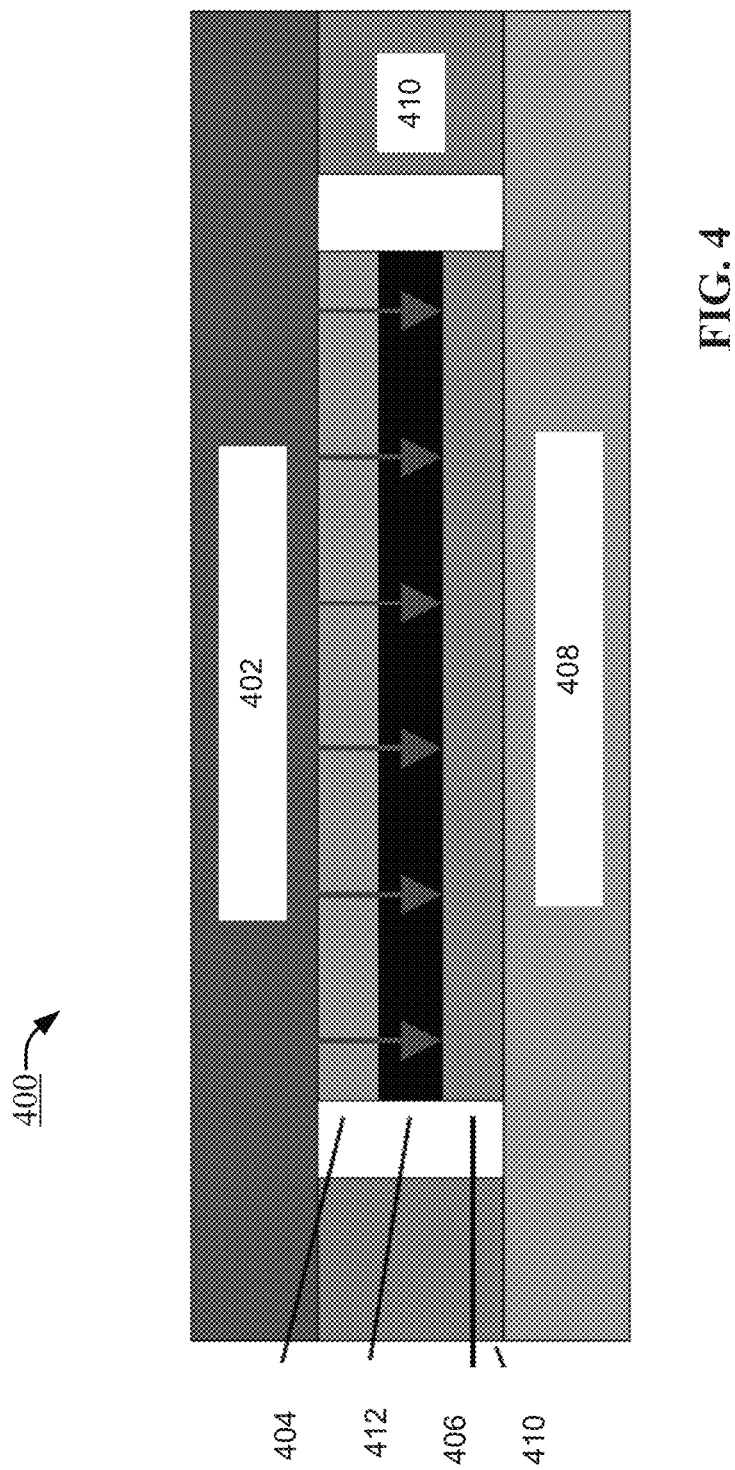
FIG. 4 provides illustration of a sensor device comprising a flexible display with a cover layer laminated to a force sensor and a rigid midframe, in accordance with aspects of the subject disclosure.

As a brief overview, as illustrated in generalized cross section in FIG. 3, a device can comprise a resistive force sensor behind a flexible surface. An example embodiment of this generalized device is illustrated in FIG. 4, where a flexible display 402 with a cover layer can have been laminated to a rigid midframe 408 supporting a touch sensor. In this example embodiment, the flexible display 402, force spreading/force concentrating layer 404, and force sensing membrane (FSM) 412 typically are all flexible. The sensor electrode layer 406 can be optionally flexible, and the rigid midframe 408 is generally inflexible (stiff) to provide the resultant device with structural support.

A force spreading or force concentrating layer 404 can be included between the flexible display 402 and the force sensing membrane 412. A force spreading layer 404 can be a flexible material that serves to spread out a localized force applied to the flexible surface 402 across a wider area on the sensor. Alternatively, a force concentrating layer 404 may be included to transmit forces to specific and desired locations on the sensor surface. In some embodiments and depending on the application, the force concentrating or force spreading layer 404 can be omitted entirely.

Figure 13A:
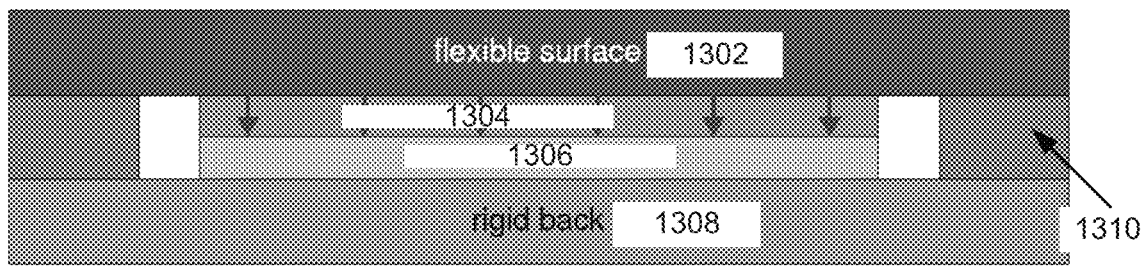
FIGS. 13A-13D illustrate different methods of securing device layers together, in accordance aspects of the subject disclosure.
Figure 13B:
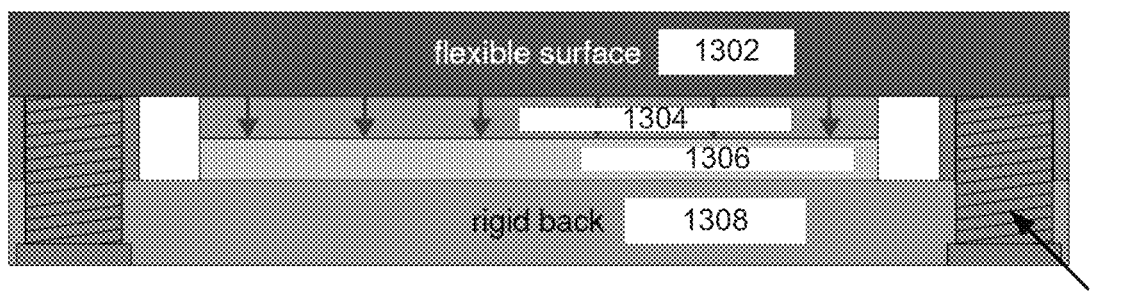
Figure 13C:
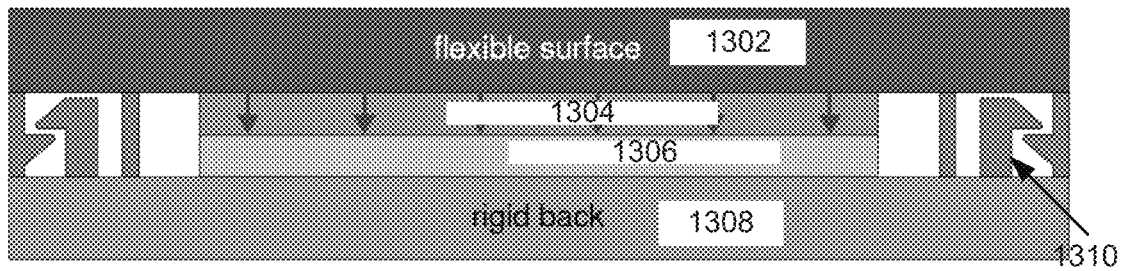
Figure 13D:
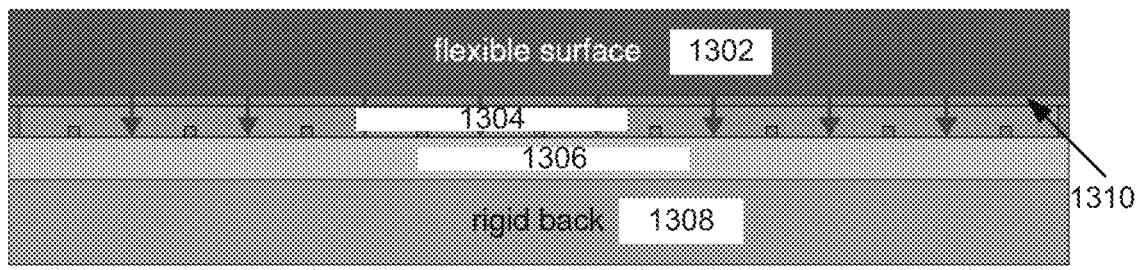

The flexible surface 402 can be secured to the rigid back 408 in a variety of ways, including a ring adhesive (e.g., pressure-sensitive adhesive, thermosetting adhesive, phase change adhesive, etc.), mechanical fasteners (e.g., screws, snap joints, hooks, etc.), or blanket adhesive layers. For example, in the context of FIGS. 13A-13D, the mechanism for securing the flexible surface 1302 to the rigid back 1308 is enumerated as 1310, wherein depicted in FIG. 13A a ring adhesive 1310 can secure the flexible surface 1302 to the rigid back 1308; in FIG. 13B screws 1310 can hold the flexible surface 1302 to the rigid back 1308; in FIG. 13C snaps 1310 can be used to secure the flexible surface 1302 to the rigid back 1308 together; and in FIG. 13D the various layers of the device can be secured through layers of adhesive. These layers can be either fully covering an interface between layers (e.g., an upper adhesive layer) or patterned within and/or between layers (e.g., lower adhesive pattern).

The individual layers of the device can be bonded in a variety of ways. All layers can be laminated, bonded, fastened, or simply stacked except for the force sensing membrane 412/sensor electrode layer 406 interface. This interface can be at most selectively adhered, since the conductive layer of a force sensing membrane typically must be allowed to change its degree of contact (and thus the voltage drop through the conductive layer) with the sensor electrode layer depending on the magnitude of force that is applied. A partial or full ring adhesive or gasket can also be employed to bond the flexible display to the midframe (e.g., enumerated as 410 in FIG. 4), to hold the other layers in place, and to seal the device from water, particulate, or contaminant ingress.

The subject disclosure describes a resistive force sensor that can be bonded to the back of a flexible surface in such a way that the flexible surface applies a constant and uniform preload on the sensor after bonding. The source of the pre-load can be a restoring force of the flexible surface that arises when the flexible surface is bent or stressed from its free, unstressed state. FIG. 3 provides illustration of this pre-load (represented as arrows) in the context of a generalized device in which a concave flexible surface (e.g., flexible surface 302) can have been laminated to a flat rigid back layer (e.g., rigid back 308). The flexible surface 302 can have been elastically-deformed by applying a compressive normal force to the layers below (e.g., force spreading layer 304 and sensor layer 306). The flexible surface 302 can also apply a tensile normal force to the bonding/fastening regions (e.g., adhesive ring/fastening region 310) as the adhesive ring/fastening region 310 attempts to relax the strain energy by returning to an unstressed state. The adhesive ring/fastening region 310 in the device can secure the rigid back layer 308 to the flexible surface 302 and prevent the flexible surface 302 from returning to an unstressed state.

In devices with a force sensing membrane such as force sensing membrane 412, as depicted in FIG. 4, the pre-load applied to the force sensing membrane 412 by a flexible display 402 can bring the force sensing membrane 412 in more intimate contact with a sensor electrode layer 406. This can increase the sensitivity of the resultant force sensor device 400 by reducing or eliminating air gap(s) between the force sensing membrane 412 and the sensor electrode layer 406. The presence of an air gap can reduce sensitivity because before an applied force can be detected, the force sensing membrane 412 must first be displaced through the air gap until it makes contact with the sensor electrode layer 406. The reduction or elimination of the air gap can also cause a small amount of contact between a conductive layer associated with the force sensing membrane 412 and the sensor electrode layer 406, resulting in a new electrical pathway. A baseline reading of the resultant sensor device 400 can be taken with no applied forces and this baseline can then be subtracted from raw sensor output to avoid false detection events. This baseline reading can also be used to compensate for any non-uniformity in the pre-load across the sensor area of the resultant force sensor device 400.

The disclosed systems and methods, in accordance with an embodiment, discloses a sensor device, comprising: an array of sensor electrodes patterned on a stiff mid-frame; a force sensing membrane applied over the array of sensor electrodes; and a flexible display layer laminated over the array of sensor electrodes and the force sensing membrane. The array of sensor electrodes can be resistive force sensor electrodes. The sensor device can further comprise a force spreading layer interposed between the force sensing membrane and the flexible display layer. The sensor device can also have a force concentrating layer interposed between the force sensing membrane and the flexible display layer. The flexible display layer can comprise a flexible cover glass layer and/or a flexible cover plastic layer. The flexible display layer can exert a compressive pre-load to the array of sensor electrodes and the force sensing membrane. The flexible display layer can also apply a tensile force to a border area of the sensor device.

In accordance with a further embodiment, the disclosure describes a device, comprising: a processor; and a memory that stores executable instructions that, when executed by the processor, facilitate performance of operations. The operations can comprise: determining a first curvature of a rigid back layer comprising a grouping of sensor electrodes; determining a second curvature of a flexible surface layer; and as a function of the first curvature and the second curvature facilitating lamination of the flexible surface layer to the rigid back layer. Additional operations can include in response to determining that the second curvature is less than the first curvature, inducing a stress in the flexible surface layer.

In accordance with various aspects, the rigid back layer can be planar; concave; or convex in a first axis. Additionally, the rigid back layer can also be planar; concave; or convex in a second axis. Further, the rigid back layer can be planar; concave; or convex in a third axis, wherein the first axis, the second axis and third axis exhibit respective orthogonality to each other. In accordance with additional aspects, the flexible surface layer can be planar; concave; or convex in a first axis, a second axis, and/or a third axis, where the first axis is perpendicular to the second axis and third axis, and the second is perpendicular to the third axis.

In accordance with the foregoing, the flexible surface layer can exert a pre-load force to the rigid back layer, and the first curvature can be determined as a function of a first radius of curvature of the rigid back layer, and the second curvature can be determined as a function of a second radius of curvature of the flexible surface layer.

In accordance with a still further embodiment, the subject disclosure describes a machine readable storage medium, a computer readable storage device, or non-tangible machine readable media comprising instructions that, in response to execution, cause a computing system comprising at least one processor to perform operations. The operations can include: determining a first curvature of a rigid back layer comprising an array of sensor electrodes; determining a second curvature of a flexible surface layer; and as a function of the first curvature and the second curvature laminating the flexible surface layer to the rigid back layer. Further operations can include inducing a stress force in the flexible surface in a first axis or a second axis based on the first curvature or the second curvature.

Now with reference to FIG. 1 that illustrates a system 100 that in accordance with various embodiments provides a system, machine, apparatus, or device for fabricating pre-loaded resistive touch sensors via lamination of differently curved surfaces. System 100, for purposes of illustration, can be any type of mechanism, machine, device, facility, apparatus, and/or instrument that includes a processor and/or is capable of effective and/or operative communication with wired and/or wireless network topologies. Mechanisms, machines, apparatuses, devices, facilities, and/or instruments that can comprise system 100 can include tablet computing devices, handheld devices, server class computing devices, machines, and/or databases, laptop computers, notebook computers, desktop computers, cell phones, smart phones, consumer appliances and/or instrumentation, industrial devices and/or components, hand-held devices, personal digital assistants, and/or consumer and/or industrial appliances and/or instrumentation.

As illustrated, system 100 can comprise fabrication engine 102 that can be in operative communication with processor 104, memory 106, and storage 108. Fabrication engine 102 can be in communication with processor 104 for facilitating operation of computer-executable instructions or machine-executable instructions and/or components by fabrication engine 102, memory 106 for storing data and/or computer-executable instructions or machine-executable instructions and/or components, and storage 108 for providing longer term storage of data and/or machine-readable instructions and/or computer-readable instructions. Additionally, system 100 can receive input 110 for use, manipulation, and/or transformation by fabrication engine 102 to produce one or more useful, concrete, and tangible result, and/or transform one or more article to different states or things. Further, system 100 can also generate and output the useful, concrete, and tangible result and/or the transformed one or more article as output 112.

Figures 5A, 5B:
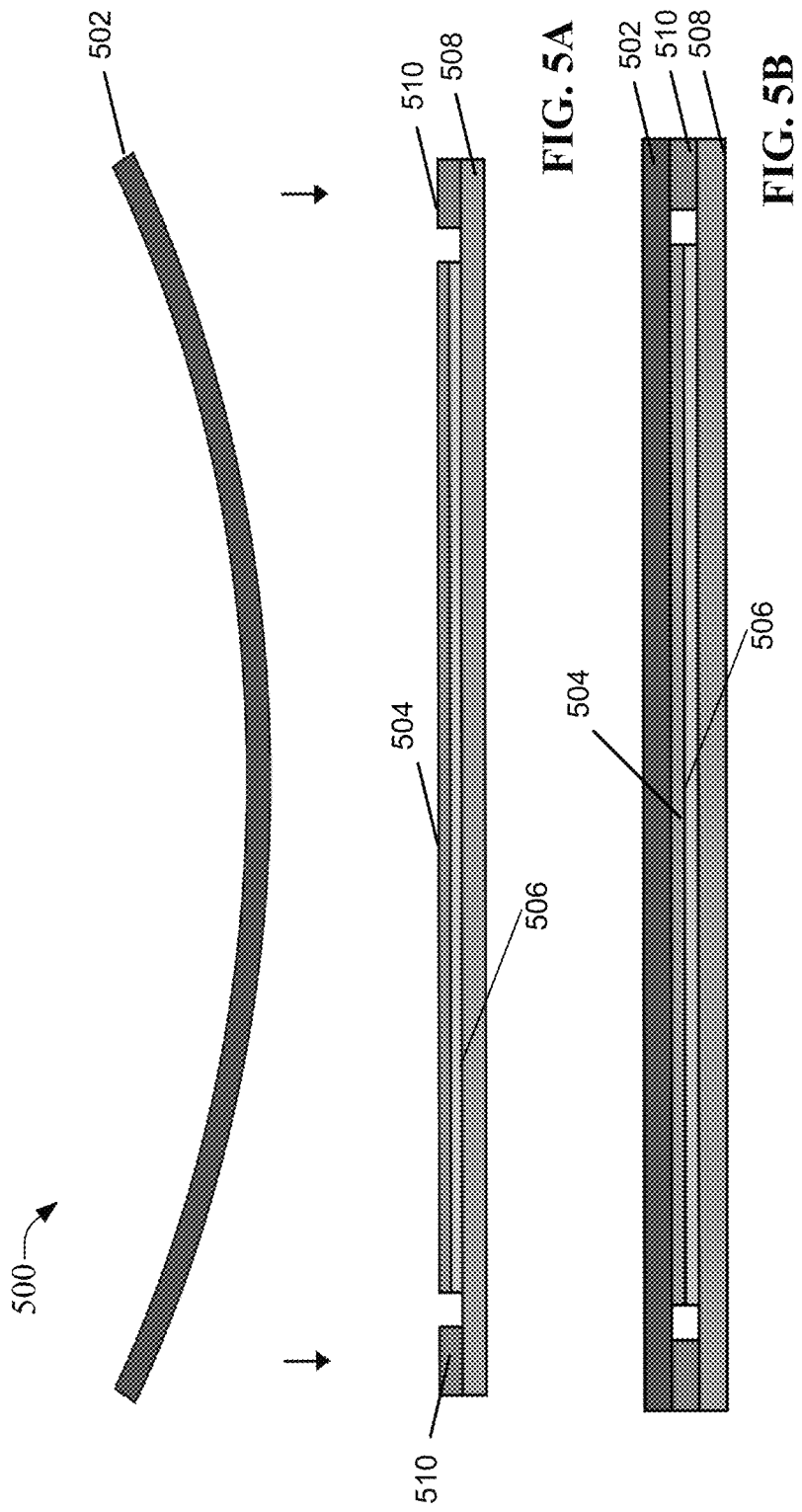
FIGS. 5A and 5B illustrates acts for laminating a flexible surface to a rigid back, in accordance with aspects of the subject disclosure.

In accordance with an embodiment, fabrication engine 102, in a case with a device with a flat rigid back layer (e.g., illustrated in FIG. 5 as rigid back 508) and a flexible surface 502 that is concave along one of its axes in its unstressed state can initiate execution of machine-executable instruction to cause a lamination device (not shown) to laminate the concave flexible surface 502 to the flat rigid back layer (e.g., rigid back 508), such that when laminated to the flat rigid back (rigid back 508), the concave flexible surface 502 can apply a compressive force to the sensor layer 506 below and can apply a tensile force to the border region (e.g., which is optionally occupied by the adhesive ring/fastening region 510).

In accordance with an additional embodiment, fabrication engine 102, in a case with a device with a convex rigid back layer (e.g., illustrated in FIG. 6 as rigid back 608) and a flexible surface 602 that is flat in its unstressed state can initiate execution of machine-executable instruction to cause a lamination device (not shown) to laminate the flat flexible surface 602 to the convex rigid back layer (e.g., rigid back 608), such that when laminated to the convex rigid back 608, the flexible surface 602 can exert a compressive force to the sensor layer 606 and can apply a outward tensile force to the border region (e.g., adhesive ring/fastening region 610).

In accordance with yet additional embodiments, fabrication engine 102, in a case with a device with a convex rigid back layer (e.g., illustrated in FIG. 7 as rigid back 708), and where the flexible surface 702 has an unstressed curvature that is also convex but with a larger radius of curvature than the rigid back 708, can initiate execution of machine-executable instruction to cause a lamination device (not shown) to laminate the flexible surface 702 to the convex rigid back layer (e.g., rigid back 708), such that when laminated to the convex rigid back 708, the flexible surface 702 can exert a compressive force (or an expansive force) to the sensor layer 706 and can apply a outward tensile force to the adhesive ring/fastening region 710.

In accordance with further additional embodiments, fabrication engine 102, in a case with a device with a convex rigid back layer (e.g., illustrated in FIG. 8 as rigid back 808), and where the flexible surface 802 has an unstressed curvature that is concave, can initiate execution of machine-executable instruction to cause a lamination device (not shown) to laminate the flexible surface 802 to the convex rigid back layer (e.g., rigid back 808), such that when laminated to the convex rigid back 808, the flexible surface 802 can exert a compressive force to the sensor layer 806 and can apply a outward tensile force to the adhesive ring/fastening region 810.

In accordance with yet further additional embodiments, fabrication engine 102, in instances with a device with a concave rigid back layer (e.g., illustrated in FIG. 9 as rigid back 908), and where the flexible surface 902 has an unstressed curvature that is more concave (e.g., has a smaller radius of curvature) than rigid back 908, can facilitate execution of machine-executable instruction to cause a lamination device (not shown) to laminate the flexible surface 902 to the rigid back layer (e.g., rigid back 908).

In the device fabrication examples depicted above the rigid back layers and flexible surfaces have been shown with a constant-curvature contour, but for each application the specific contour of the rigid back layer and unstressed flexible surface can be designed so that the pre-load is uniform across the surface of the sensor layer(s).

In certain embodiments, achieving a pre-load does not necessarily rely on entire parts having a specific curvature. Instead, the outermost layer may be shaped such that it presents a curved surface to the mating part without the entire part itself being curved. For example, FIG. 10 depicts an example device 1000 in which a force concentrating/force spreading layer 1004 has a convex shape so that the contact stresses can be uniformly spread across the sensor layer 1006 when the flexible surface 1002 is secured to the rest of the device. Such a convex shape can be necessary because basic contact mechanics states that contact between two nominally flat surfaces can result in localized force concentrations near the edges of the mating surfaces. Device 1000 shown in FIG. 10 is but one example of this concept; a convex shape can also be applied to other layers (e.g., the underside of the flexible layer 1002 or the top of the sensor layer 1006 when the force concentrating/force spreading layer 1004 is absent, for example) to allow for a uniform pre-load after bonding.

Figure 11A:
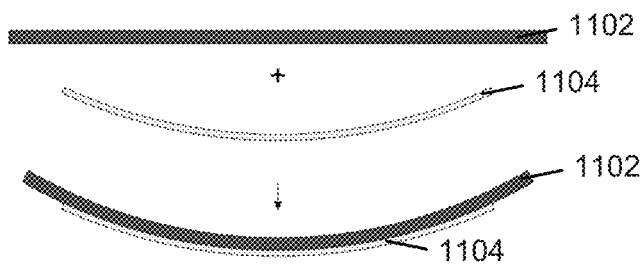
FIGS. 11A-11D illustrates acts for creating a curved laminate comprising a flexible display and a cover layer, in accordance with aspects of the subject disclosure.
Figure 11B:
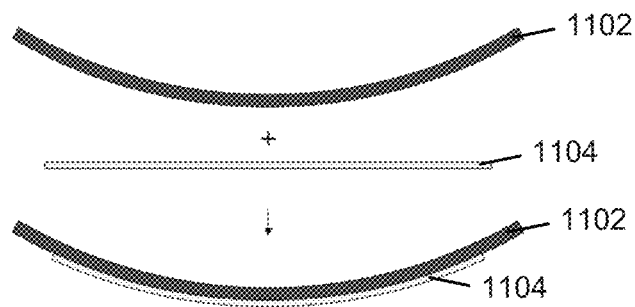
Figure 11C:
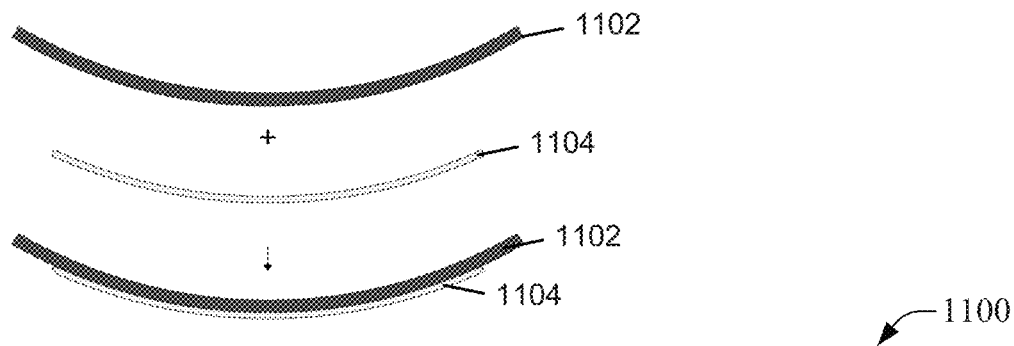
Figure 11D:
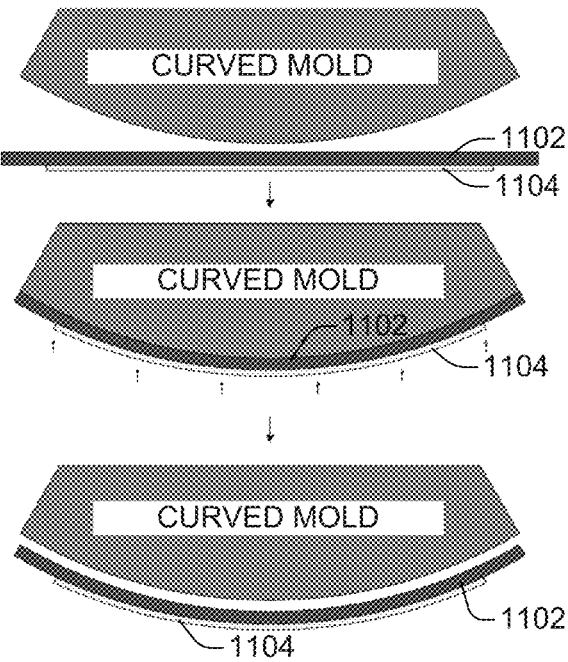

Several methods for achieving a pre-load can involve using flexible surfaces that are naturally curved when the flexible surface is in an unstressed state. For example, in some embodiments, the resultant device can comprise a flexible display with a cover layer, as illustrated in FIG. 4 where the display and a cover layer need not have exactly matching initial curvatures. Instead, several different techniques can be used to achieve an unstressed curvature in a display/cover layer laminate. For example, with reference to FIGS. 11A-11D, where a cover layer 1102 is made of glass, a polymeric material, or a composite of the two, for example, in accordance with an aspect the curved cover layer 1102 can laminated to a curved flexible display 1104, resulting in a curved display/cover layer laminate (see FIG. 11A). The cover layer 1102 and flexible display 1104 can have the same or different initial curvatures. In accordance with a further aspect, a flat cover layer can laminated to a curved flexible display, resulting in a curved display/cover layer laminate (see FIG. 11B). In accordance with another aspect, a curved cover layer can laminated to a flat flexible display, resulting in a curved display/cover layer laminate (see FIG. 11C). Further, in accordance with an additional aspect, a flat flexible display can be laminated to a flat cover layer with an uncured or partially cured adhesive (e.g. a liquid optically cured adhesive). This laminate can then be pressed onto a curved mold and heat, ultraviolet light, or additional time can be applied to allow the adhesive interlayer to fully cure. Since the display/cover layer laminate is cured in a curved state, the final cured laminate can retain its curved shape after removal from the mold (see FIG. 11D).

The concept of creating a pre-load by bonding a flexible surface to a force sensor can be applied to devices that are curved on either the long or short axis of the device. Devices can also be curved in two dimensions (e.g., forming an arc of a sphere), additionally, an interference fit between the flexible surface and the mating part containing the rigid back can also create a desired pre-load for cylindrical devices. Alternatively, processes described in the contexts of FIGS. 5 and 10 can result in flat devices.

The use of a force sensing array (e.g., force sensing layer 306) is not meant to be limiting. The same pre-load approaches described herein can also be applied to other sensors and sensor types. These sensors can include one large sensor element, a series of discrete sensors or sensor grids and/or arrays. Methodologies for detecting force can include the use of force sensing resistive (FSR) sensors, force sensing capacitive sensors (FSC), piezoelectric sensors, strain gauges and optical sensors among others.

Any display which can bend or which can transmit force when force is applied can be used. Example display types can include liquid crystal display (LCD), organic liquid crystal display (OLED), electrophoretic (E-Ink) displays, Quantum Dot Displays, and Micro-LED displays that can be built up on either a glass or a plastic substrate.

Front surfaces (e.g., flexible membranes) can include glass, plastic, or composites. These surfaces can be coated to provide desired hardness, surface finish, cosmetic or optical properties. Furthermore, these surfaces can be composed of laminate which can include layers of glass laminated to plastic to create desired stiffness, cosmetic or durability properties. Furthermore, soft layers, including silicones, foam or rubber layers can be laminated to provide desired squishiness or shock-absorption properties.

Although this disclosure presents a stack which has a specific order, this is not meant to be limiting. For example, a force sensor can be laminated directly below a flexible surface with a force spreading or force concentrating layer between the force sensor and a rigid backing. The force sensor can also be embedded within the flexible surface, or in the case of embodiments containing a display, it can be embedded into or on top of the display. Furthermore, the ordering of the layers of the force sensor itself can be reversed, with the force sensing membrane being below the electrode layer. Other configurations can comprise of several layers of electrodes that can intersect with each other.

Layers within the disclosed stacks can serve multiple functions. For example, the force spreading or force concentrating layer can also function as a backlight for an LCD display, or as a heat-dissipating layer in an OLED display. The force spreading or force concentrating layer can also help to cushion impact on the display. Furthermore, in some configurations, the force spreading or force concentrating layer can be interposed between the force sensing layer and the electrode layer, or can positioned be between two layers of sensor electrodes in the case that the sensor array is made up of two sets of row and column electrodes, or the force spreading layer could also be one and the same as the force sensing polymer layer.

Figure 2:
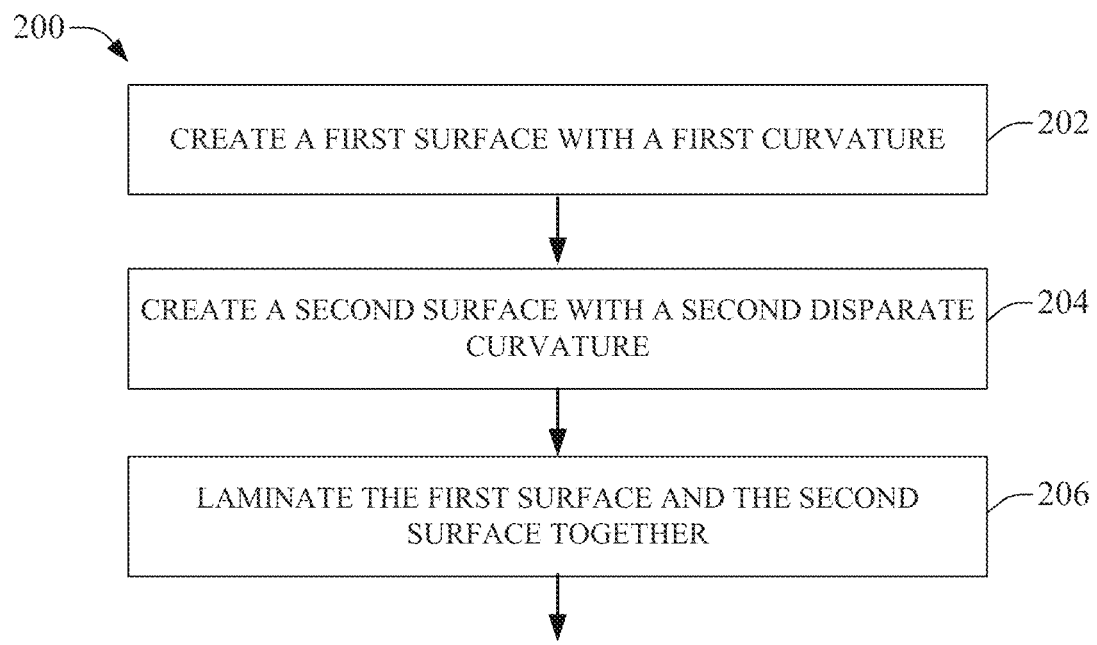
FIG. 2 provides illustration of a flow or method for fabricating a sensor device that is preloaded via lamination of disparately curved surfaces, in accordance with aspects of the subject disclosure.

In view of the example system(s) described above, example method(s) that can be implemented in accordance with the disclosed subject matter can be better appreciated with reference to flowchart in FIG. 2. For purposes of simplicity of explanation, example method disclosed herein is presented and described as a series of acts; however, it is to be understood and appreciated that the disclosure is not limited by the order of acts, as some acts may occur in different orders and/or concurrently with other acts from that shown and described herein. For example, one or more example methods disclosed herein could alternatively be represented as a series of interrelated states or events, such as in a state diagram. Moreover, interaction diagram(s) may represent methods in accordance with the disclosed subject matter when disparate entities enact disparate portions of the methods. Furthermore, not all illustrated acts may be required to implement a described example method in accordance with the subject specification. Further yet, the disclosed example method can be implemented in combination with one or more other methods, to accomplish one or more aspects herein described. It should be further appreciated that the example method disclosed throughout the subject specification are capable of being stored on an article of manufacture (e.g., a computer-readable medium) to allow transporting and transferring such methods to computers for execution, and thus implementation, by a processor or for storage in a memory.

FIG. 2 illustrates a generalized method 200 for fabricating pre-loaded resistive touch sensor devices via lamination of differently curved surfaces in accordance with an embodiment. Method 200 can commence at 202 where a fabrication engine 102 can facilitate creating a first curvature to a first surface. At 204 fabrication engine 102 can facilitate creating a second disparate curvature to a second surface. At 206 fabrication engine 102 can facilitate lamination of the first surface with second surface.

In accordance with the foregoing, in cases where a sensor device with a flat rigid back layer is being manufactured, fabrication engine 102 can initiate execution of machine-executable instructions to facilitate a stressing machine to induce stress in a flexible surface so that the flexible surface becomes concave along at least one of its axes such that when the flexible surface is unstressed it maintains the induced concavity. Further, fabrication engine 102 facilitate execution of machine-executable instructions to cause a lamination apparatus to laminate the concave flexible surface to the flat rigid back layer, such that when laminated to the flat rigid back, the now concave flexible surface can apply a compressive force to a sensor layer situated below and can apply a tensile force to an adhesive ring/fastening region.

In accordance with a additional or alternative embodiment, fabrication engine 102, in cases where a sensor device with a convex rigid back layer is being fabricated, can initiate execution of machine-executable instructions to facilitate a stressing apparatus to relax a flexible surface so that the flexible surface becomes flat or planar such that when the flexible surface is unstressed it is less convex or more planar than the convex rigid back. Thereafter, fabrication engine 102 can initiate execution of machine-executable instruction to facilitate a lamination machine to laminate the relaxed flexible surface to the convex rigid back layer, such that when laminated to the convex rigid back, the now more planar flexible surface 602 can exert a force (e.g., expansion or torsion) to the sensor layer and can apply a outward tensile force to the border regions.

In accordance with yet additional or alternative embodiments, fabrication engine 102, in instances where devices with convex rigid back layers are being manufactured and where a flexible surface has an unstressed curvature that is concave, can facilitate execution of machine-executable instruction to cause a lamination apparatus to laminate the flexible surface to the convex rigid back layer, such that when laminated to the convex rigid back, the relaxed flexible surface can exert a force to the sensor layer and can apply a outward tensile force to the border regions.

In accordance with further additional embodiments, fabrication engine 102 in instances where devices with concave (e.g., smaller radius of curvature) rigid back layers are being made, initiate execution of machine-executable instructions to facilitate stressing devices to ensure that a flexible surface has an unstressed curvature that is more concave (e.g., has a smaller radius of curvature) than the rigid back. In response to determining that the unstressed curvature of the flexible surface has a smaller radius of curvature than the rigid back, fabrication engine 102 can facilitate execution of machine-executable instruction to facilitate a lamination apparatus to laminate the flexible surface to the rigid back layer.

With reference to FIG. 3, this figure illustrates a generalized cross section of a fabricated device 300 comprising a flexible surface 302 that has been laminated to a force sensor layer 306. The force sensor layer 306 can be supported by the stiff back layer of the device 308. An optional force spreading layer or force concentrating layer 304 can be included above the sensor layer 306. The flexible surface 302 can be laminated to this entire stack to create the desired pre-load for the fabricated device 300. An optional ring adhesive or fasteners 310 can be included along the margin of the device. The generalize cross section stacking is used throughout this disclosure for easy of elucidation and/or exposition without limitation or loss of generality, as alterative layering combinations and/or permutations are within the ambit of the subject disclosure.

In connection with FIG. 4 illustrates a fabricated device 400 (e.g., a resistive force sensor) that can be manufactured in accordance with the subject disclosure. Fabricated device 400 can comprise a flexible display 402 with a cover layer that can have been laminated to form a resistive force sensor 400. The device stack can be supported, for instance, by a stiff midframe 408. The sensor electrode layer 406 can rest on the midframe 408 for support. A force sensing membrane 412 (with a conductive layer facing the sensor electrode layer 406) can be situated between a force spreading and/or force concentration layer 404. Interposition of the force spreading and/or force concentrating layer 404 between the flexible display 402 and the force sensing membrane 412 can be optional in some application embodiments. The flexible display 402 comprising at least a flexible cover glass or cover plastic layer can be laminated to this entire stack to create a desired pre-load in the fabricated device 400. An optional ring adhesive 410 can also be included along the margins of the fabricated device 400.

Figure 12:
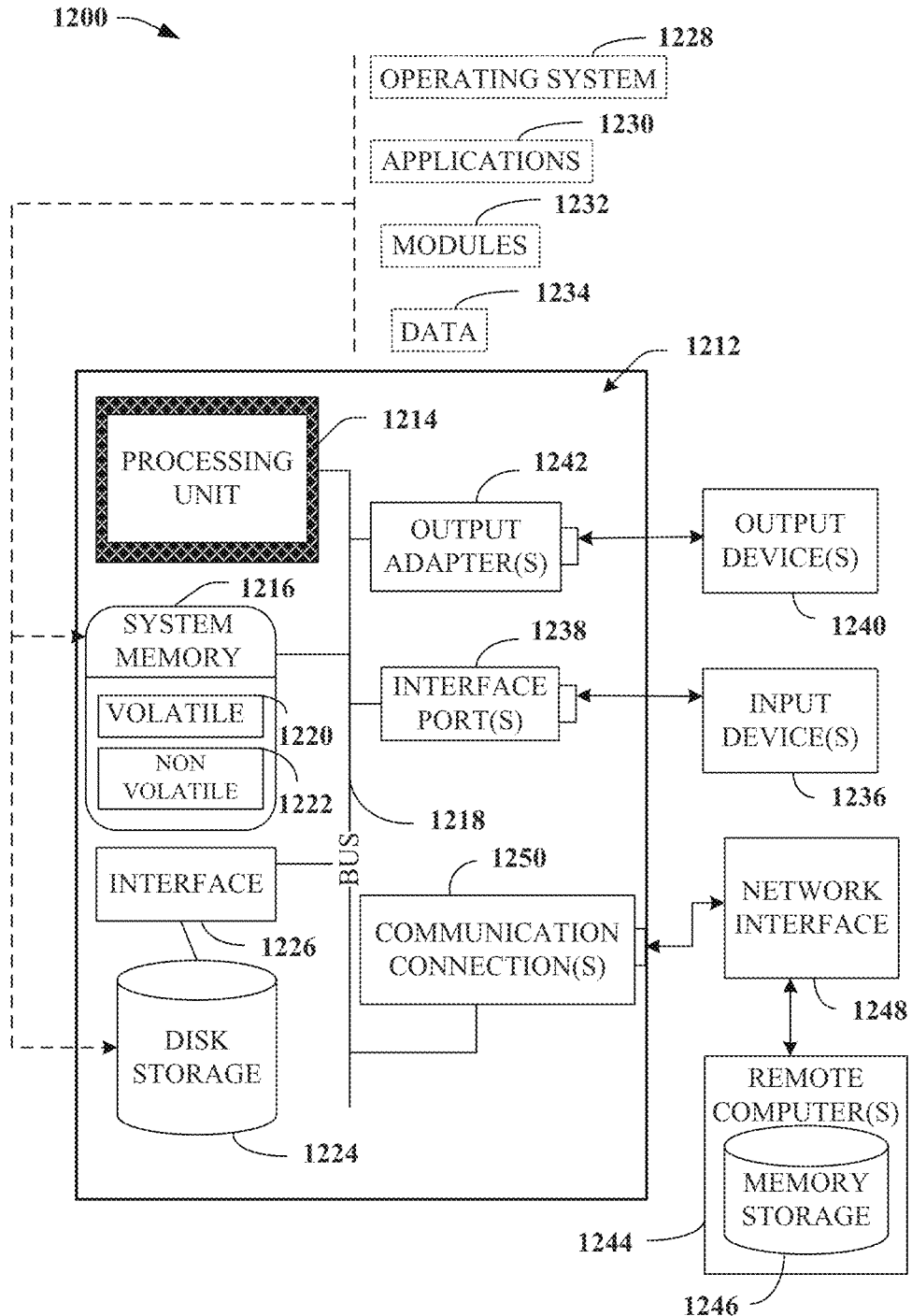
FIG. 12 illustrates a block diagram of a computing system operable to execute the disclosed systems and methods in accordance with an embodiment.

In order to provide a context for the various aspects of the disclosed subject matter, FIG. 12, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules include routines, programs, components, data structures, etc. that perform particular tasks and/or implement particular abstract data types.

In the subject specification, terms such as "store," "storage," "data store," data storage," "database," and substantially any other information storage component relevant to operation and functionality of a component, refer to "memory components," or entities embodied in a "memory" or components comprising the memory. It will be appreciated that the memory components described herein can be either volatile memory or nonvolatile memory, or can include both volatile and nonvolatile memory, by way of illustration, and not limitation, volatile memory 1220 (see below), non-volatile memory 1222 (see below), disk storage 1224 (see below), and memory storage 1246 (see below). Further, nonvolatile memory can be included in read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

Moreover, it will be noted that the disclosed subject matter can be practiced with other computer system configurations, including single-processor or multiprocessor computer systems, mini-computing devices, mainframe computers, as well as personal computers, hand-held computing devices (e.g., PDA, phone, watch, tablet computers, netbook computers, . . . ), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

FIG. 12 illustrates a block diagram of a computing system 1200 operable to execute the disclosed systems and methods in accordance with an embodiment. Computer 1212, which can be, for example, part of the hardware of system 120, includes a processing unit 1214, a system memory 1216, and a system bus 1218. System bus 1218 couples system components including, but not limited to, system memory 1216 to processing unit 1214. Processing unit 1214 can be any of various available processors. Dual microprocessors and other multiprocessor architectures also can be employed as processing unit 1214.

System bus 1218 can be any of several types of bus structure(s) including a memory bus or a memory controller, a peripheral bus or an external bus, and/or a local bus using any variety of available bus architectures including, but not limited to, Industrial Standard Architecture (ISA), Micro-Channel Architecture (MSA), Extended ISA (EISA), Intelligent Drive Electronics, VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1194), and Small Computer Systems Interface (SCSI).

System memory 1216 can include volatile memory 1220 and nonvolatile memory 1222. A basic input/output system (BIOS), containing routines to transfer information between elements within computer 1212, such as during start-up, can be stored in nonvolatile memory 1222. By way of illustration, and not limitation, nonvolatile memory 1222 can include ROM, PROM, EPROM, EEPROM, or flash memory. Volatile memory 1220 includes RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 1212 can also include removable/non-removable, volatile/non-volatile computer storage media. FIG. 12 illustrates, for example, disk storage 1224. Disk storage 1224 includes, but is not limited to, devices like a magnetic disk drive, floppy disk drive, tape drive, flash memory card, or memory stick. In addition, disk storage 1224 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1224 to system bus 1218, a removable or non-removable interface is typically used, such as interface 1226.

Computing devices typically include a variety of media, which can include computer-readable storage media or communications media, which two terms are used herein differently from one another as follows.

Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible media which can be used to store desired information. In this regard, the term "tangible" herein as may be applied to storage, memory or computer-readable media, is to be understood to exclude only propagating intangible signals per se as a modifier and does not relinquish coverage of all standard storage, memory or computer-readable media that are not only propagating intangible signals per se. In an aspect, tangible media can include non-transitory media wherein the term "non-transitory" herein as may be applied to storage, memory or computer-readable media, is to be understood to exclude only propagating transitory signals per se as a modifier and does not relinquish coverage of all standard storage, memory or computer-readable media that are not only propagating transitory signals per se. For the avoidance of doubt, the term "computer-readable storage device" is used and defined herein to exclude transitory media. Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

It can be noted that FIG. 12 describes software that acts as an intermediary between users and computer resources described in suitable operating environment 1200. Such software includes an operating system 1228. Operating system 1228, which can be stored on disk storage 1224, acts to control and allocate resources of computer system 1212. System applications 1230 take advantage of the management of resources by operating system 1228 through program modules 1232 and program data 1234 stored either in system memory 1216 or on disk storage 1224. It is to be noted that the disclosed subject matter can be implemented with various operating systems or combinations of operating systems.

A user can enter commands or information into computer 1212 through input device(s) 1236. As an example, mobile device and/or portable device can include a user interface embodied in a touch sensitive display panel allowing a user to interact with computer 1212. Input devices 1236 include, but are not limited to, a pointing device such as a mouse, trackball, stylus, touch pad, keyboard, microphone, joystick, game pad, satellite dish, scanner, TV tuner card, digital camera, digital video camera, web camera, cell phone, smartphone, tablet computer, etc. These and other input devices connect to processing unit 1214 through system bus 1218 by way of interface port(s) 1238. Interface port(s) 1238 include, for example, a serial port, a parallel port, a game port, a universal serial bus (USB), an infrared port, a Bluetooth port, an IP port, or a logical port associated with a wireless service, etc. Output device(s) 1240 use some of the same type of ports as input device(s) 1236.

Thus, for example, a USB port can be used to provide input to computer 1212 and to output information from computer 1212 to an output device 1240. Output adapter 1242 is provided to illustrate that there are some output devices 1240 like monitors, speakers, and printers, among other output devices 1240, which use special adapters. Output adapters 1242 include, by way of illustration and not limitation, video and sound cards that provide means of connection between output device 1240 and system bus 1218. It should be noted that other devices and/or systems of devices provide both input and output capabilities such as remote computer(s) 1244.

Computer 1212 can operate in a networked environment using logical connections to one or more remote computers, such as remote computer(s) 1244. Remote computer(s) 1244 can be a personal computer, a server, a router, a network PC, cloud storage, cloud service, a workstation, a microprocessor based appliance, a peer device, or other common network node and the like, and typically includes many or all of the elements described relative to computer 1212.

For purposes of brevity, only a memory storage device 1246 is illustrated with remote computer(s) 1244. Remote computer(s) 1244 is logically connected to computer 1212 through a network interface 1248 and then physically connected by way of communication connection 1250. Network interface 1248 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit-switching networks like Integrated Services Digital Networks (ISDN) and variations thereon, packet switching networks, and Digital Subscriber Lines (DSL). As noted below, wireless technologies may be used in addition to or in place of the foregoing.

Communication connection(s) 1250 refer(s) to hardware/software employed to connect network interface 1248 to bus 1218. While communication connection 1250 is shown for illustrative clarity inside computer 1212, it can also be external to computer 1212. The hardware/software for connection to network interface 1248 can include, for example, internal and external technologies such as modems, including regular telephone grade modems, cable modems and DSL modems, ISDN adapters, and Ethernet cards.

Figure 14:
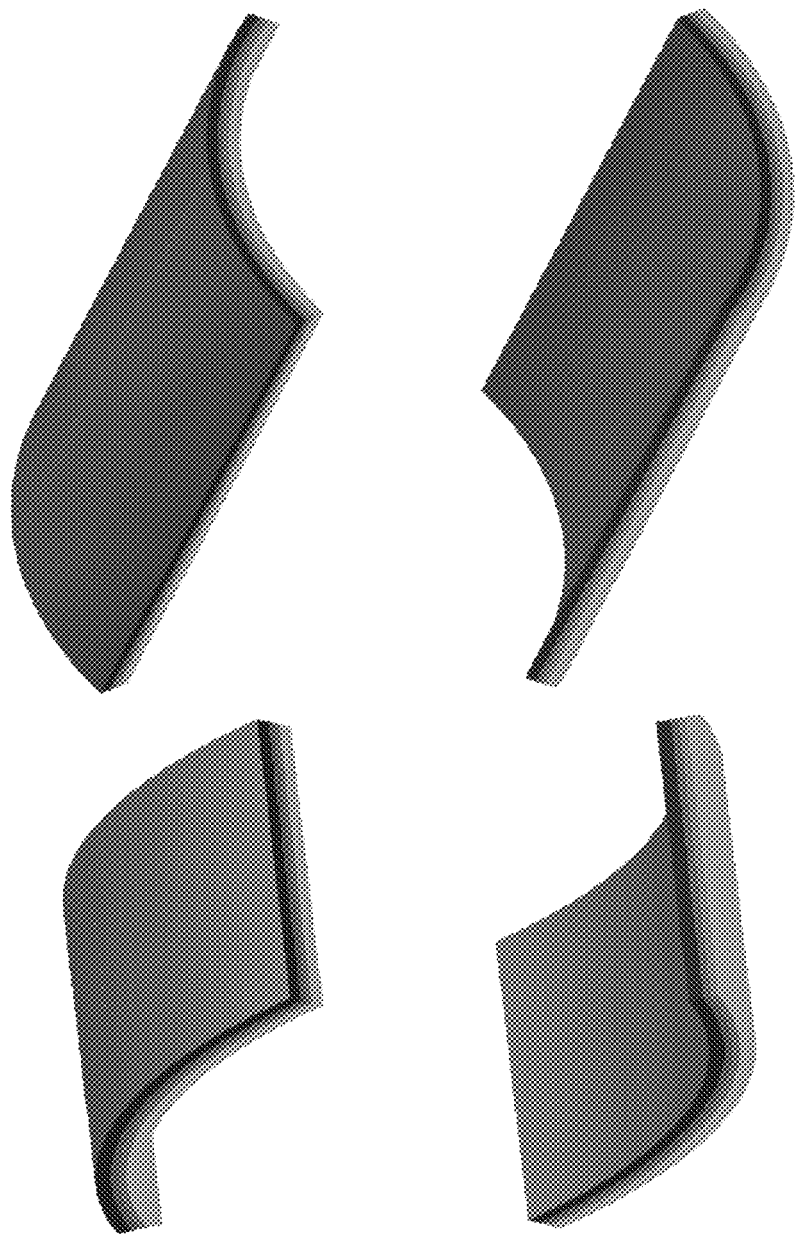
FIG. 14 illustrates example rectangular devices with curvatures along a first axis or a second axis, in accordance with described aspects of the subject disclosure.

In the context of FIG. 14 depicted are examples of convex (top) and concave (bottom) rectangular devices with curvature along long axis (left) or short axis (right). For ease of exposition, these devices are shown without adhesive or fasteners.

In regard to FIG. 15 illustrated are examples of convex (left) and concave (right) devices with two-dimensional curvatures. Once again, for ease of exposition, these devices are shown without adhesive or fasteners.

Figure 16:
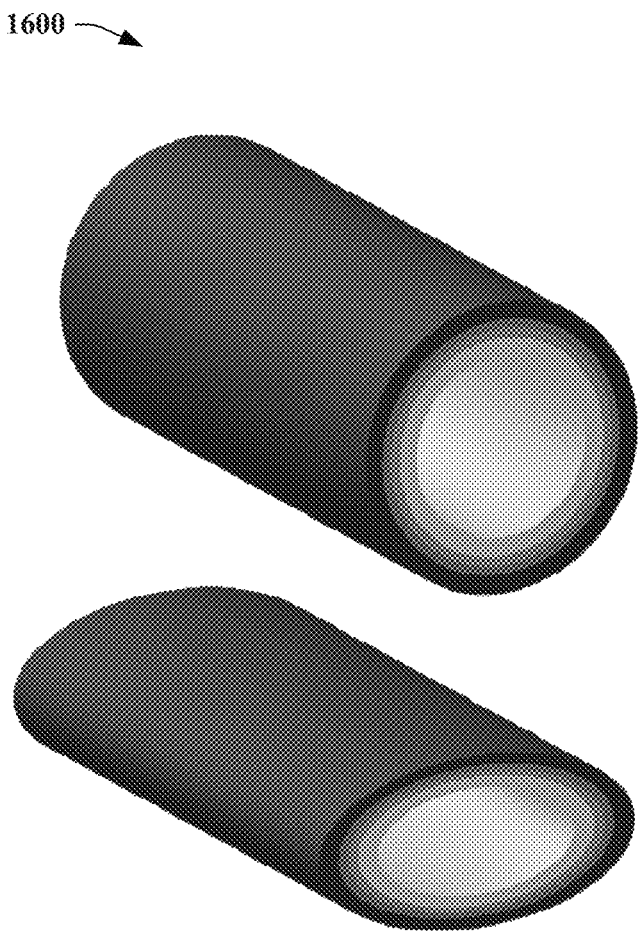
FIG. 16 illustrates example cylindrical and elliptic cylindrical devices, in accordance with described embodiments of the subject disclosure.

In the context of FIG. 16 illustrated are example devices with cylindrical (top) and elliptical cylindrical (bottom) shapes. These devices are shown without adhesive or fasteners.

Figure 17:
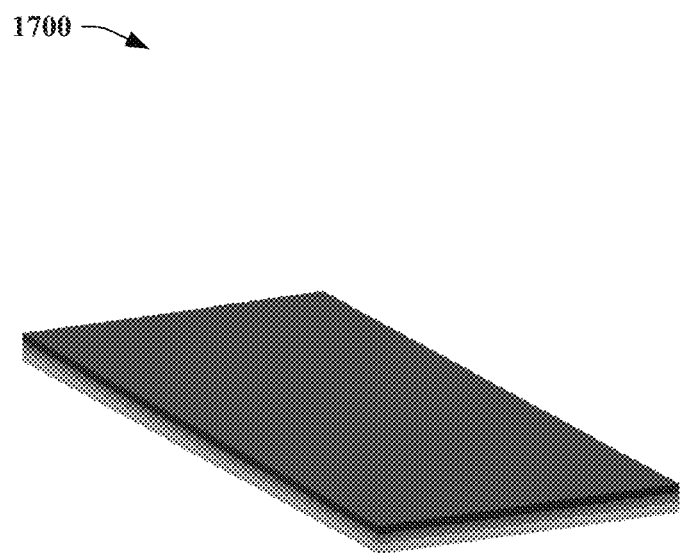
FIG. 17 illustrates an example flat rectangular device in accordance with one or more described embodiments set forth in the subject disclosure.

With regard to FIG. 17 illustrated is an example flat rectangular device. Once again, for easy of exposition the device is depicted without adhesives and/or fasteners.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

In the subject specification, terms such as "store," "storage," "data store," data storage," "database," and substantially any other information storage component relevant to operation and functionality of a component, refer to "memory components," or entities embodied in a "memory" or components comprising the memory. It will be appreciated that the memory components described herein can be either volatile memory or nonvolatile memory, or can include both volatile and nonvolatile memory.

As used in this application, the terms "component," "system," "platform," "layer," "selector," "interface," and the like are intended to refer to a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media, device readable storage devices, or machine readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

Moreover, terms like "user equipment (UE)," "mobile station," "mobile," subscriber station," "subscriber equipment," "access terminal," "terminal," "handset," and similar terminology, refer to a wireless device utilized by a subscriber or user of a wireless communication service to receive or convey data, control, voice, video, sound, gaming, or substantially any data-stream or signaling-stream. The foregoing terms are utilized interchangeably in the subject specification and related drawings. Likewise, the terms "access point (AP)," "base station," "NodeB," "evolved Node B (eNodeB)," "home Node B (HNB)," "home access point (HAP)," "cell device," "sector," "cell," and the like, are utilized interchangeably in the subject application, and refer to a wireless network component or appliance that serves and receives data, control, voice, video, sound, gaming, or substantially any data-stream or signaling-stream to and from a set of subscriber stations or provider enabled devices. Data and signaling streams can include packetized or frame-based flows.

Additionally, the terms "core-network", "core", "core carrier network", "carrier-side", or similar terms can refer to components of a telecommunications network that typically provides some or all of aggregation, authentication, call control and switching, charging, service invocation, or gateways. Aggregation can refer to the highest level of aggregation in a service provider network wherein the next level in the hierarchy under the core nodes is the distribution networks and then the edge networks. UEs do not normally connect directly to the core networks of a large service provider but can be routed to the core by way of a switch or radio area network. Authentication can refer to determinations regarding whether the user requesting a service from the telecom network is authorized to do so within this network or not. Call control and switching can refer determinations related to the future course of a call stream across carrier equipment based on the call signal processing. Charging can be related to the collation and processing of charging data generated by various network nodes. Two common types of charging mechanisms found in present day networks can be prepaid charging and postpaid charging. Service invocation can occur based on some explicit action (e.g. call transfer) or implicitly (e.g., call waiting). It is to be noted that service "execution" may or may not be a core network functionality as third party network/nodes may take part in actual service execution. A gateway can be present in the core network to access other networks. Gateway functionality can be dependent on the type of the interface with another network.

Furthermore, the terms "user," "subscriber," "customer," "consumer," "prosumer," "agent," and the like are employed interchangeably throughout the subject specification, unless context warrants particular distinction(s) among the terms. It should be appreciated that such terms can refer to human entities or automated components (e.g., supported through artificial intelligence, as through a capacity to make inferences based on complex mathematical formalisms), that can provide simulated vision, sound recognition and so forth.

Aspects, features, or advantages of the subject matter can be exploited in substantially any, or any, wired, broadcast, wireless telecommunication, radio technology or network, or combinations thereof. Non-limiting examples of such technologies or networks include Geocast technology; broadcast technologies (e.g., sub-Hz, ELF, VLF, LF, MF, HF, VHF, UHF, SHF, THz broadcasts, etc.); Ethernet; X.25; powerline-type networking (e.g., PowerLine AV Ethernet, etc.); femto-cell technology; Wi-Fi; Worldwide Interoperability for Microwave Access (WiMAX); Enhanced General Packet Radio Service (Enhanced GPRS); Third Generation Partnership Project (3GPP or 3G) Long Term Evolution (LTE); 3GPP Universal Mobile Telecommunications System (UMTS) or 3GPP UMTS; Third Generation Partnership Project 2 (3GPP2) Ultra Mobile Broadband (UMB); High Speed Packet Access (HSPA); High Speed Downlink Packet Access (HSDPA); High Speed Uplink Packet Access (HSUPA); GSM Enhanced Data Rates for GSM Evolution (EDGE) Radio Access Network (RAN) or GERAN; UMTS Terrestrial Radio Access Network (UTRAN); or LTE Advanced.

What has been described above includes examples of systems and methods illustrative of the disclosed subject matter. It is, of course, not possible to describe every combination of components or methods herein. One of ordinary skill in the art may recognize that many further combinations and permutations of the disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

What is claimed is:

1. A device, comprising:
    a processor; and
    a memory that stores executable instructions that, when executed by the processor, facilitate performance of operations, comprising:
        determining a first curvature of a rigid back layer comprising a grouping of sensor electrodes;
        determining a second curvature of a flexible surface layer; and
        as a function of the first curvature and the second curvature facilitating lamination of the flexible surface layer to the rigid back layer, wherein the flexible surface layer, in response to the lamination, exerts a compressive force to the grouping of sensor electrodes and an outward tensile force to a border region.

2. The device of claim 1, wherein the rigid back layer is planar.

3. The device of claim 1, wherein the rigid back layer is concave.

4. The device of claim 1, wherein the rigid back layer is convex.

5. The device of claim 1, wherein the flexible surface layer is concave.

6. The device of claim 1, wherein the flexible surface layer is convex.

7. The device of claim 1, wherein the flexible surface layer exerts a pre-load force to the rigid back layer.

8. The device of claim 1, wherein the first curvature is determined as a function of a first radius of curvature of the rigid back layer and the second curvature is determined as a function of a second radius of curvature of the flexible surface layer.

9. The device of claim 1, wherein the operations further comprise in response to determining that the second curvature is less than the first curvature, inducing a stress in the flexible surface layer.

10. A non-transitory machine-readable medium, comprising executable instructions that, when executed by a processor, facilitate performance of operations, comprising:
   determining a first curvature of a rigid back layer comprising an array of sensor electrodes;
   determining a second curvature of a flexible surface layer; and
   as a function of the first curvature and the second curvature laminating the flexible surface layer to the rigid back layer, wherein the flexible surface layer, in response to the laminating, exerts a compressive force to compress the array of sensor electrodes in conformance to the first curvature and provides an outward tensile force to a border region associated with the rigid back layer.

11. The non-transitory machine-readable medium of claim 10, wherein the operations further comprise inducing a stress force in the flexible surface in a first axis or a second axis based on the first curvature or the second curvature.

12. An apparatus, comprising:
a processor; and
a memory that stores instructions that, when executed by the processor, facilitates performance of operations, comprising:
   determining a first curvature of a rigid back layer comprising an array of force sensors;
   determining a second curvature of a flexible surface layer; and
   laminating the flexible surface layer to the rigid back layer based on the first curvature and the second curvature, wherein in response to the laminating, the flexible surface layer exerts a compressive force on the array of force sensors positioned on the rigid back layer and a tensile force directed toward an adhesive region associated with the rigid back layer.

13. The apparatus of claim 12, wherein the force sensors are resistive force sensor electrodes.

14. The apparatus of claim 12, wherein the flexible surface layer comprises a flexible display layer configured to create a pre-load compressive force that conforms the flexible surface layer to the rigid back layer in accordance with the first curvature and the second curvature.

15. The apparatus of claim 12, wherein the rigid back layer is concave.

16. The apparatus of claim 12, wherein the rigid back layer is convex.

17. The apparatus of claim 12, wherein the first curvature is determined based on a first radius of curvatures of the rigid back layer.

18. The apparatus of claim 12, wherein the second curvature is determined based on a second radius of curvature of the flexible surface layer.

19. The apparatus of claim 12, wherein the operations further comprise determining that the second curvature is less than the first curvature.

20. The apparatus of claim 19, wherein the operations further comprise in response to determining that the first curvatures is greater than the second curvature, inducing a stress in the flexible surface layer.

* * * * *